US 6,678,295 B2

(12) United States Patent
Ito (10) Patent No.: US 6,678,295 B2
(45) Date of Patent: Jan. 13, 2004

(54) LASER DRIVE CONTROL APPARATUS AND METHODS

(75) Inventor: Koji Ito, Motosu-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 57 days.

(21) Appl. No.: 09/819,632

(22) Filed: Mar. 29, 2001

(65) Prior Publication Data

US 2001/0048700 A1 Dec. 6, 2001

(30) Foreign Application Priority Data

May 11, 2000 (JP) ........................................ 2000-138791

(51) Int. Cl.[7] ................................................ H01S 3/00
(52) U.S. Cl. ................................... 372/38.02; 372/38.1
(58) Field of Search ............................... 372/38.02, 38.1

(56) References Cited

U.S. PATENT DOCUMENTS 5,995,246 A * 11/1999 Komiya et al. ............. 358/481
6,266,078 B1 * 7/2001 Koga et al. ................. 347/236

FOREIGN PATENT DOCUMENTS

JP           B2 63-42432    * 8/1981    ........... H01S/3/096

* cited by examiner

Primary Examiner—Paul Ip
Assistant Examiner—Leith A Al-Nazer
(74) Attorney, Agent, or Firm—Oliff & Berridge, PLC (57) ABSTRACT

According to the invention, a laser drive control circuit in a multibeam scanner comprises a regulation unit that provides reference values for a plurality of beam emitting points, respectively. The reference values are adjusted so that the total sum of the reference values is a predetermined value. The laser drive control circuit controls the beam emitting points, successively, to emit laser beams except when scanning a photosensitive drum, and detects the respective beam amounts of laser beams. Then, the laser drive control circuit adjusts driving currents fed to the beam emitting points for scanning the photosensitive drum upon the comparison of the detected beam amounts and reference values, respectively.

18 Claims, 6 Drawing Sheets

LASER DRIVE CONTROL APPARATUS AND METHODS

BACKGROUND OF THE INVENTION

1. Field of Invention

The invention relates to a laser drive control apparatus, especially for a multibeam scanner comprising a plurality of beam emitting points.

2. Description of Related Art

Conventional multibeam scanners emit a plurality of laser beams from laser diodes simultaneously and scan a scan surface of a photosensitive material (such as a photosensitive drum) with the plurality of laser beams, thereby forming an image on the scan surface. Multibeam scanners scan a surface at a higher speed than single-laser scanners, and thus improve recording speed.

SUMMARY OF THE INVENTION

To keep high image quality, it is necessary for multibeam scanners to perform Automatic Power Control (APC), because the respective laser diodes of the scanners have difficulties in stabilizing the beam amount of the laser beam therefrom. Even if each laser diode is driven with a constant driving current, the temperature of the laser diode increases due to its beam emission, and the luminous efficiency of the laser diode decreases with the temperature increase.

Therefore, as disclosed in Japanese Patent No. 63-42432, multibeam scanners perform APC for feeding a driving current to the laser diode, so that the laser diode always emits the laser beam of an appropriate beam amount. More specifically, the Japanese Patent No. 63-42432 discloses a multibeam scanner having a control circuit, a constant-current circuit, and a photoreceptor. The control circuit controls each of the laser diodes that emit a laser beam. The photoreceptor detects the laser beams emitted from the laser diodes and determines beam amounts. The photoreceptor gives a feedback of the beam amounts to the control circuit. Upon reception of the feedback, the control circuit compares the feedback with reference values. Based on the comparison, the control circuit controls the constant-current circuit to feed the appropriate driving currents so that the respective laser diodes emit the laser beams of appropriate beam amounts. The reference values are provided for each of the respective laser diodes.

However, all the laser diodes do not always have the same current-emission characteristic. Even if the laser diodes have the same current-emission characteristic, it is inevitable that incident angles against the photoreceptor vary from laser beam to laser beam. Such variations in incident angles are caused by the laser diodes not being properly placed in exact positions and orientations, or by broadening of the laser beams. Therefore, in order to perform APC properly, the respective reference values for the laser diodes need to be provided.

Conventional multibeam scanners comprise a plurality of output circuits for outputting the reference values, respectively, for the laser beams. Further, it is necessary to adjust the setting of each of the output circuits on an individual basis, so that each of the output circuits outputs the appropriate reference value. Thus, such conventional multibeam scanners are expensive, time consuming and labor consuming to manufacture.

In the view of the foregoing, the present invention has been developed to resolve the above-mentioned and other problems.

According to one aspect of the invention, there is provided a laser drive control apparatus for controlling a plurality of beam emitting points to emit a plurality of laser beams, respectively, to form scanning lines during a predetermined time period, the laser drive control apparatus comprising a first control unit that controls a plurality of beam emitting points to emit a plurality of laser beams successively except during a predetermined time period, a photoreceptor that detects each of the laser beams emitted under the control of the first control unit and generates a beam amount signal indicating a beam amount of the laser beam for each of the plurality of beam emitting points, a providing unit that provides a plurality of reference values corresponding to the plurality of beam emitting points, respectively, when the photoreceptor generates the beam amount signals, a comparison unit that compares the beam amount signals with the corresponding reference values, respectively, and a second control unit that controls, based on the comparison made by the comparison unit, the plurality of beam emitting points to emit the laser beams to form the scanning lines during the predetermined time period, and wherein the plurality of reference values are set so that the total sum of the reference values is a predetermined value.

According to another aspect of the invention, there is provided a method for controlling a plurality of beam emitting points to emit a plurality of laser beams, respectively, to form scanning lines during a predetermined time period, comprising first controlling a plurality of beam emitting points to emit a plurality of laser beams successively except during a predetermined time period, detecting each of the laser beams emitted in the first controlling step, generating a beam amount signal indicating a beam amount of the laser beam for each of the plurality of beam emitting points, providing a plurality of reference values corresponding to the plurality of beam emitting points, respectively, when the beam amount signals are generated, comparing the beam amount signals with the corresponding reference values, respectively, and second controlling, the plurality of beam emitting points based on the comparison made in the comparing step to emit the laser beams to form the scanning lines during the predetermined time period, and wherein the plurality of reference values are set so that the total sum of the reference values is a predetermined value.

According to still another aspect of the invention, there is provided a method of setting a plurality of reference values corresponding to a plurality of beam emitting points, respectively, for use in controlling the plurality of beam emitting points to emit laser beams of appropriate amounts, the method comprising the step of balancing the plurality of reference values so that the total sum of the plurality of reference values is a predetermined value.

BRIEF DESCRIPTION OF THE DRAWINGS

The invention will be more clearly understood from the following description, given by the way of example only, with reference to the accompanying drawings in which.

DETAILED DESCRIPTION OF PREFERRED EMBODIMENTS

Figure 1:
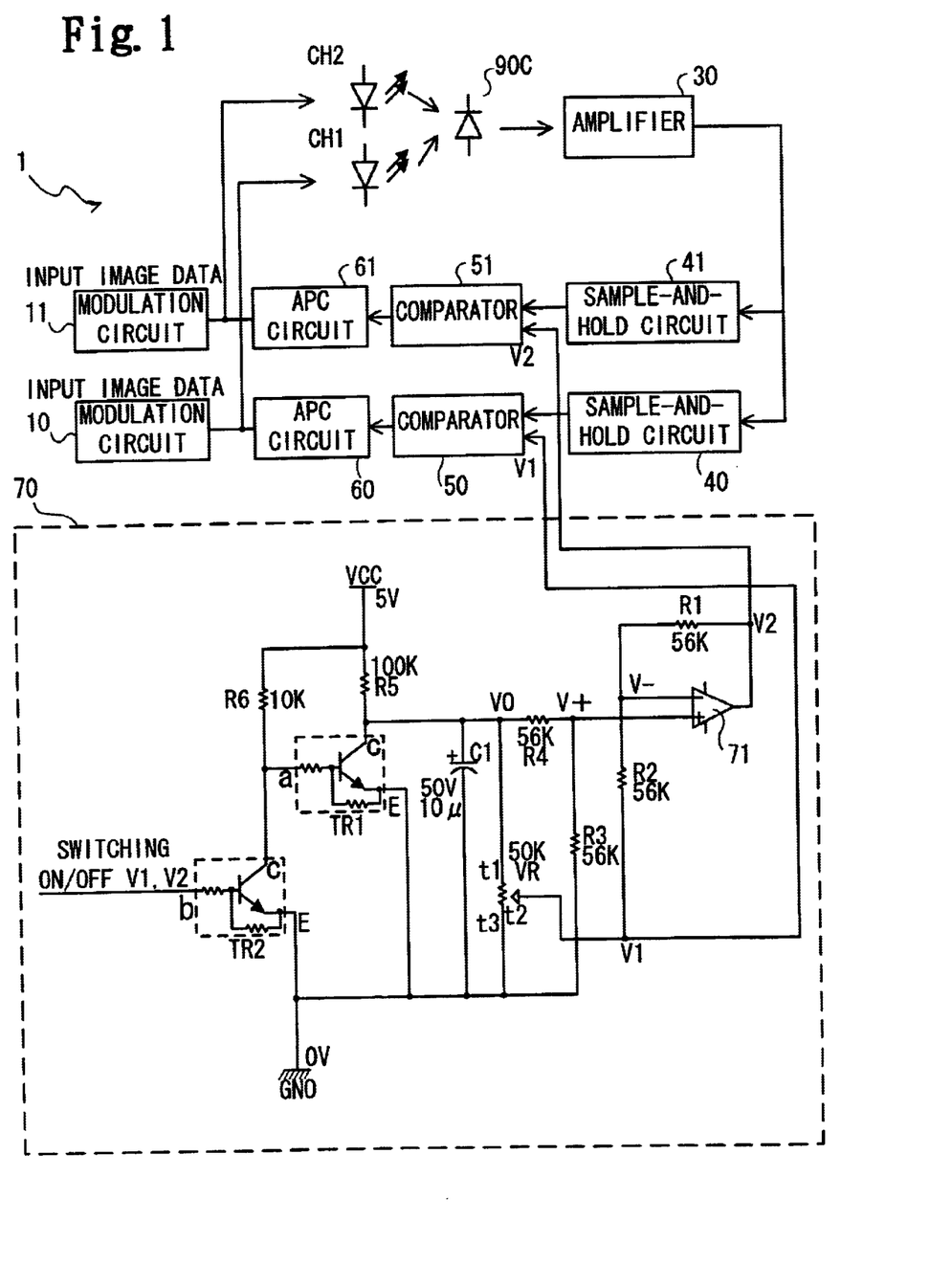
FIG. 1 is a block diagram of a laser drive control apparatus according to one exemplary embodiment of the invention.

An explanation will be given of a laser drive control apparatus in accordance with the invention based on the following exemplary embodiments. Herein, the exemplary embodiments refer to an exemplary laser drive control circuit 1 for controlling a multibeam scanner, as shown in FIG. 1.

Figure 2:
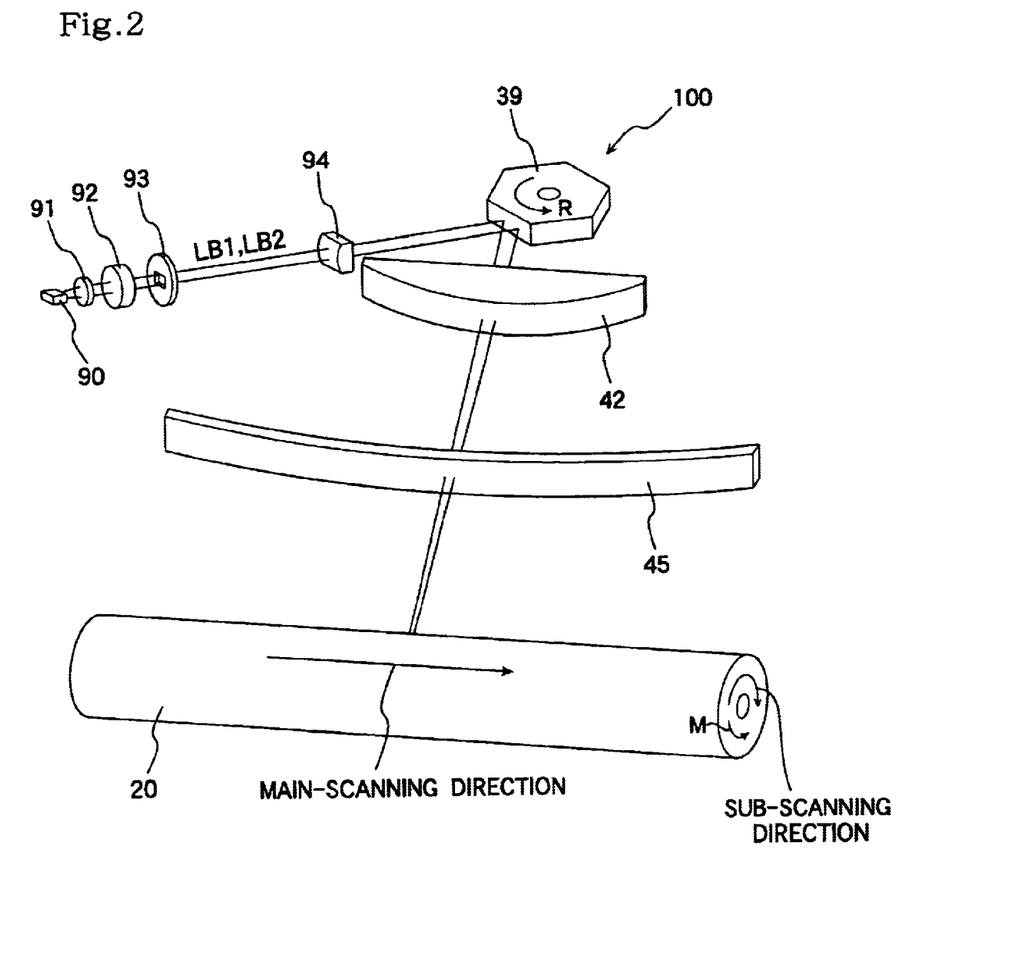
FIG. 2 is a perspective view of a multibeam scanner controlled by the laser drive control apparatus according to an exemplary embodiment of the invention.
Figure 3:
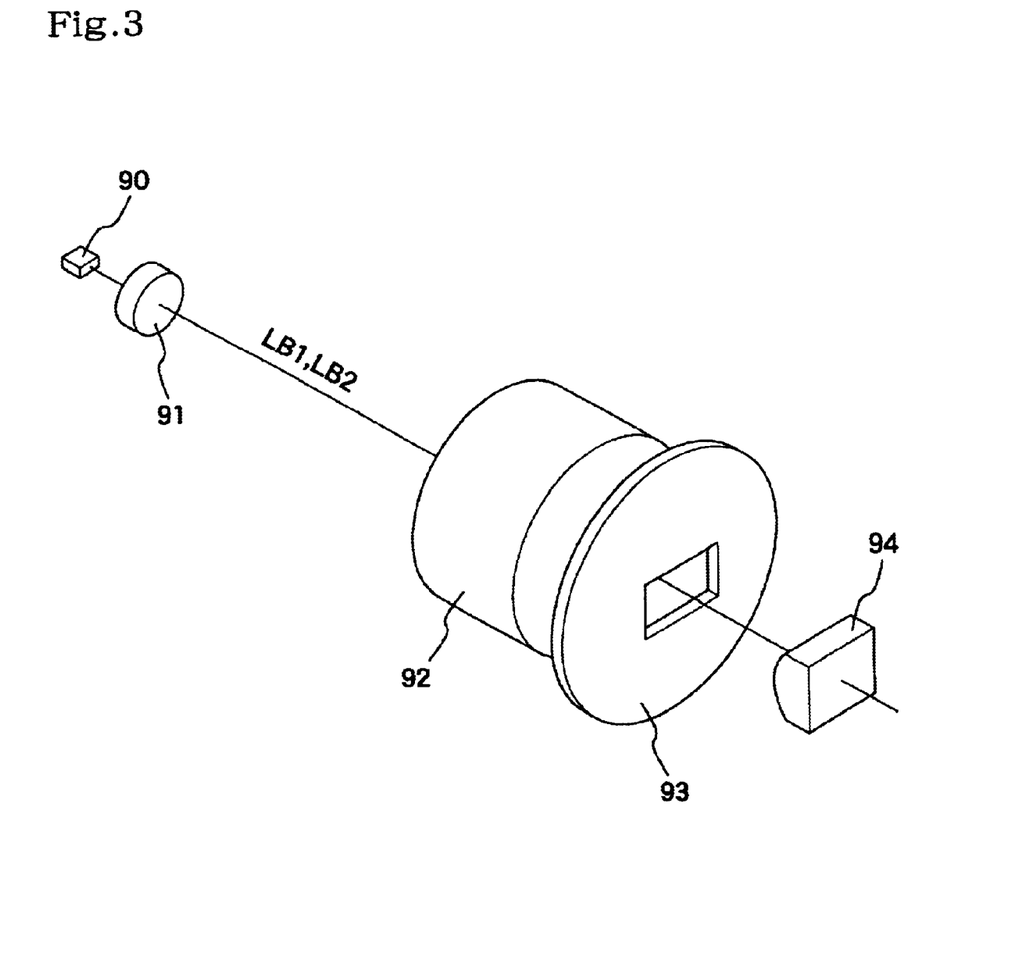
FIG. 3 is a perspective view of a collimating portion of the multibeam scanner of FIG. 2.

FIG. 2 is a perspective view of a multibeam scanner 100 according to one embodiment of the invention, and FIG. 3 is a perspective view of a collimating portion of the multibeam scanner 100.

Figure 5:
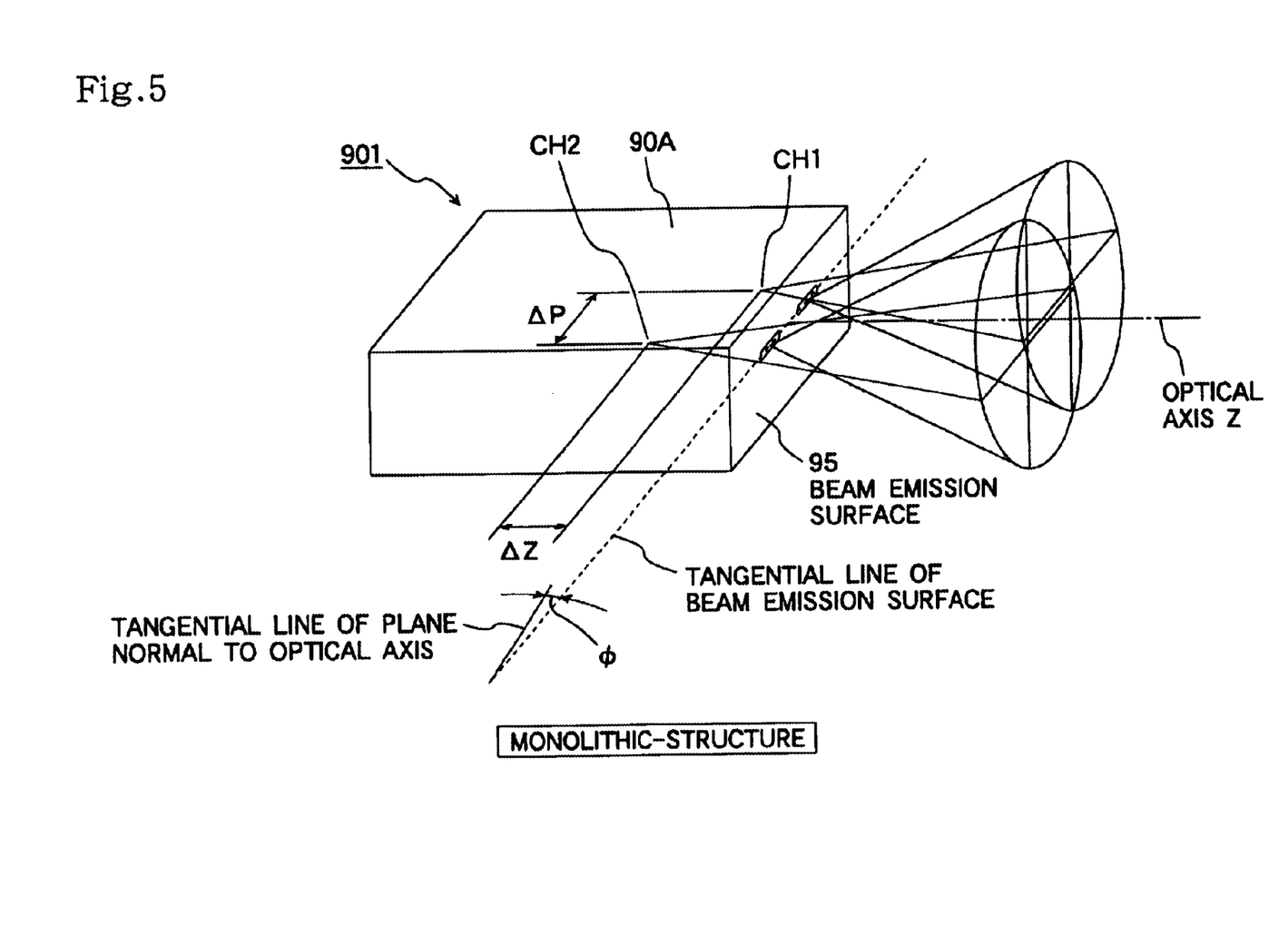
FIG. 5 schematically shows a monolithic-structured laser diode provided in the beam source according to one exemplary embodiment of the invention.
Figure 6:
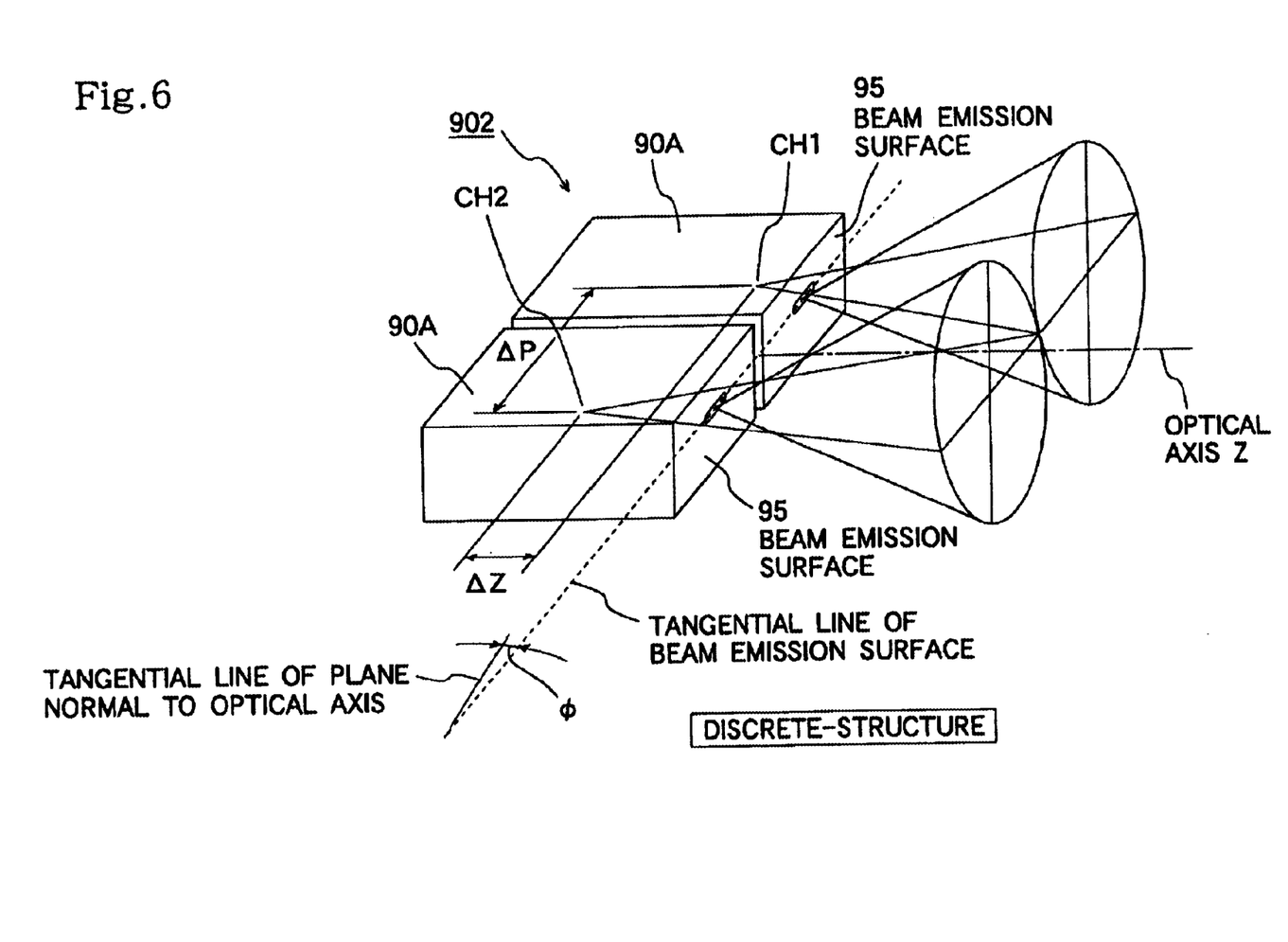
FIG. 6 schematically shows a discrete-structured laser diode provided in the beam source according to another exemplary embodiment of the invention.

The multibeam scanner 100 comprises a beam source 90 for emitting a plurality of laser beams, a cover lens 91, a collimator lens 92, a slit 93, a cylindrical lens 94, a polygon mirror 39, a fθ lens 42, and a toric lens 45. In various exemplary embodiments, the beam source 90 includes two beam emitting points CH1 and CH2 (as shown in FIGS. 5 and 6) for emitting laser beams LB1 and LB2, respectively.

When emitted from the beam source 90, the laser beams LB1 and LB2 are collimated by the collimator lens 92, and pass through the slit 93. Then, the laser beams LB1 and LB2 are converged in a sub-scanning direction by the cylindrical lens 94 and reach the polygon mirror 39. The sub-scanning direction is opposite to a direction of rotation of a photosensitive drum 20. The polygon mirror 39, is driven by a motor (not shown in figures), and rotates in a direction indicated by an arrow R (shown in FIG. 2) at a constant rotation velocity. While the polygon mirror 39 is rotating, the laser beams LB1 and LB2 are deflected by the polygon mirror 39 simultaneously toward a photosensitive drum 20 so that the laser beams LB1 and LB2 globally move in a main-scanning direction at a constant angular velocity. The main scanning direction is a direction along the axis of the photosensitive drum 20. The deflected laser beams LB1 and LB2 are further converged in the main-scanning direction by the fθ lens 42, and are converged in the sub-scanning direction by the toric lens 45.

Before scanning the photosensitive drum 20, the laser beam LB1 reaches a beam detector (not shown in figures). The beam detector receives the laser beam LB1, and determines a scan start time upon the detection of the laser beam LB1. Accordingly, the laser beams LB1 and LB2 start forming a set of scanning lines on the photosensitive drum 20 along the main-scanning direction based on the determined scan start time.

Further, the photosensitive drum 20 is rotated in a direction indicated by an arrow M (shown in FIG. 2), and is driven by a stepping motor (not shown in the figures), in synchronism with the scan start times. Thus, the laser beams LB1 and LB2 successively form a plurality of sets of scanning lines on the photosensitive drum 20, thereby forming an image with the scanning lines.

Figure 4:
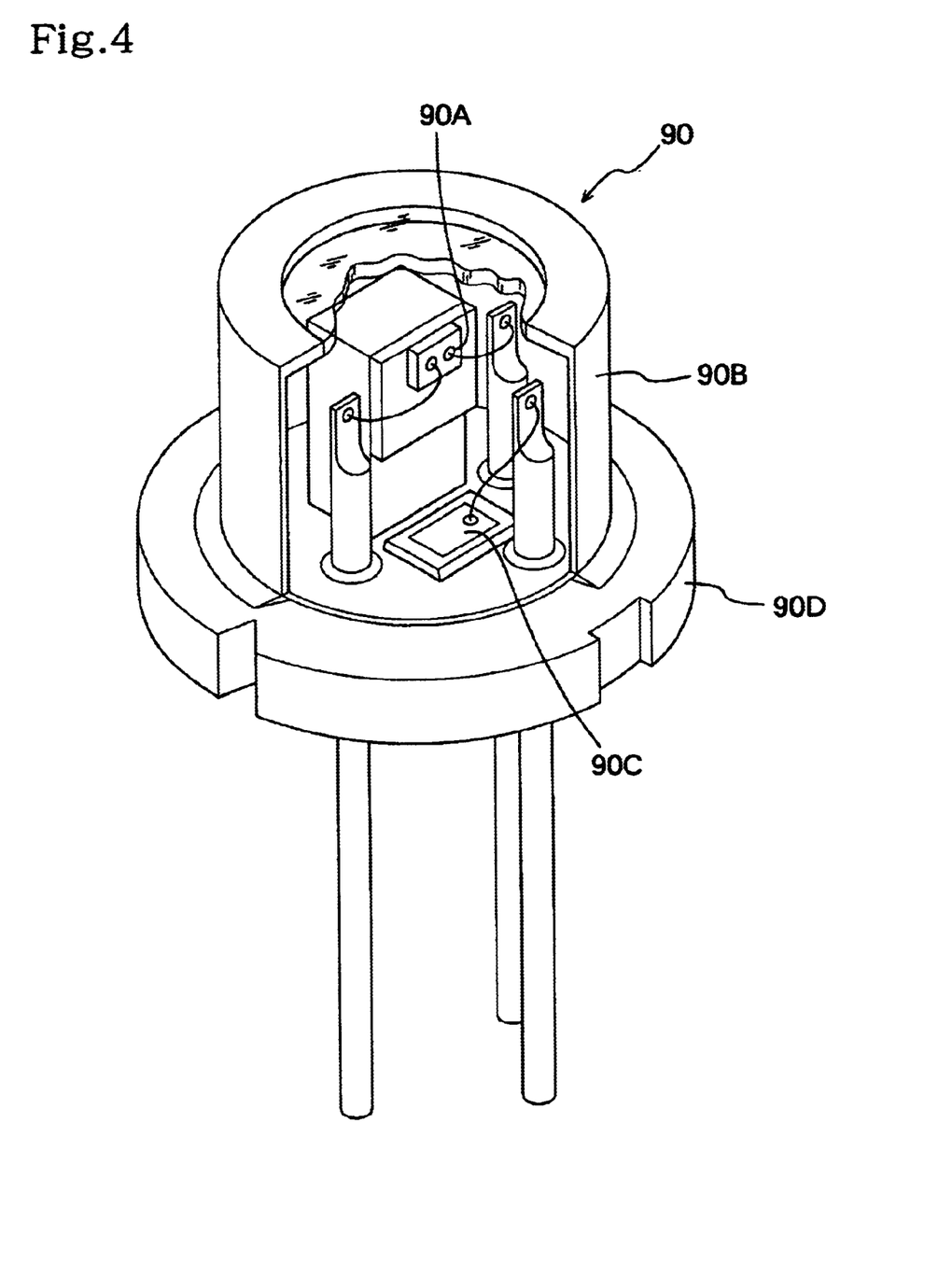
FIG. 4 is a perspective view of a beam source provided in the multibeam scanner of FIG. 2.

FIG. 4 is a perspective view of the beam source 90. The beam source 90 comprises therein at least one laser element 90A, a cap 90B covering the at least one laser element 90A, a p-i-n photoreceptor 90C for detecting respective beam amounts for performing APC (described below in detail) and a stem 90D mounting the at least one laser element 90A, the cap 90B and the p-i-n photoreceptor 90C.

The beam source 90 may comprise a single laser element 90A having a plurality of beam emitting points, each beam emitting point emitting a laser beam therefrom, as shown in FIG. 5. In various exemplary embodiments, the laser element 90A is a laser diode. This type of laser diode is hereinafter referred to as a "monolithic-structured laser diode 901". Alternatively, the beam source 90 may comprise a plurality of laser elements 90A, with each laser diode having a single beam emitting point for emitting a laser beam therefrom, as shown in FIG. 6. This type of laser diode is hereinafter referred to as a "discrete-structured laser diode 902". Both of the monolithic-structured laser diode 901 and the discrete-structured laser diode 902 have the beam emitting points CH1 and CH2 globally located within the interior of the respective diodes.

According to the present invention, the laser drive control circuit 1 is provided for performing APC properly for the beam emitting points CH1 and CH2, so that each of the beam emitting points CH1 and CH1 emit the laser beams of the required, appropriate beam amounts for forming the scanning lines on the photosensitive drum 20.

FIG. 1 is a block diagram of the laser drive control circuit 1 according to one exemplary embodiment of the invention.

The laser drive control circuit 1 comprises modulation circuits 10 and 11, the p-i-n photoreceptor 90C, an amplifier 30, sample-and-hold circuits 40 and 41, comparators 50 and 51, APC circuits 60 and 61, a regulation circuit 70 and a CPU (not shown in figures).

Except for when scanning the photosensitive drum 20 with the laser beams LB1 and LB2, the CPU controls the modulation circuits 10 and 11 to switch on and off the beam emitting points CH1, CH2, whereby the beam emitting points CH1 and CH2 emit the laser beams LB1 and LB2 successively. Then, some of the laser beams LB1 and LB2 are guided to the p-i-n photoreceptor 90C.

The p-i-n photoreceptor 90C detects the laser beams LB1 and LB2 and outputs beam amount signals S1 and S2 indicating beam amounts of the laser beams LB1 and LB2 emitted toward the polygon mirror 41, respectively. The amplifier 30 amplifies the beam amount signals S1 and S2 at a predetermined scaling. The sample-and-hold circuits 40 and 41 sample and hold the outputs of the amplifier 30, which are produced by amplifying the signals S1 and S2, respectively. The regulation circuit 70 provides reference values V1 and V2 corresponding to the beam emitting points CH1 and CH2, respectively. The comparator 50 compares the reference value V1 with the output of the sample-and-hold circuit 40, while the comparator 51 compares the reference value V2 with the output of the sample-and-hold circuit 41. The APC circuits 60 and 61 adjust the driving currents applied to the beam emitting points CH1 and CH2, based on the outputs of the comparators 50 and 51, respectively.

When the reference value Vi is greater than the output of the sample-and-hold circuit 40, the APC circuit 60 determines that the beam emitting point CH1 is emitting a laser beam LB1 of a larger beam amount than the required, appropriate beam amount of the laser beam LB1 for scanning. Thus, the APC circuit 60 adjusts to feed a smaller driving current to the beam emitting point CH1, so that the beam emitting point CH1 emits the laser beam LB1 of the appropriate beam amount. On the other hand, when the reference value V1 is smaller than the output of the sample-and-hold circuit 40, the APC circuit 60 determines that the beam emitting point CH1 is emitting a laser beam LB1 of a smaller beam amount than the required, appropriate beam amount. The APC circuit 60 adjusts to give a greater driving current to the beam emitting point CH1, so that the beam emitting point CH1 emits the laser beam of the appropriate beam amount. The APC circuit 61 operates, in connection with the laser beam LB1, the reference value V2 and the emittng point CH2, in a similar manner to the APC circuit 60.

The modulation circuits 10 and 11 also control the inputting of image data into the beam emitting points CH1 and CH2, and modulate the driving currents, which have been adjusted by the APC circuits 60 and 61, based on the image data, respectively, thereby forming the scanning lines with the laser beams LB1 and LB2.

It is noted that due to manufacturing errors, the beam emitting points CH1 and CH2 may be misaligned by a distance AZ along an optical axis Z, as shown in FIGS. 5 and 6. In addition, each beam emission surface 95 of the laser elements 90A may not be orientated completely normal to the optical axis Z, as shown in FIGS. 5 and 6. If the laser element 90A is not placed in an exact position and orientation, as mentioned above, there is formed an angle φ between the beam emission surface 95 and a plane normal to the optical axis Z. Thus, incident angles of the laser beams LB1 and LB2 against the p-i-n photoreceptor 90C vary from beam emitting point to beam emitting point.

As a result, the beam amounts detected by the p-i-n photoreceptor 90C vary widely, even if the variation of current-emission characteristics between the beam emitting points CH1 and CH2 are reduced to the point where the variation does not create a problem or the beam emitting points CH1, CH2 actually emit the laser beams LB1, LB2 of the same beam amount.

The reference values V1 and V2 should be the same value, if the beam emitting points CH1 and CH2 have the same current-emission characteristic and the beam emitting points CH1 and CH2 are placed in an exact position and orientation. However, the reference values V1 and V2 need to be provided for the beam emitting points CH1 and CH2, respectively, for the above-mentioned reasons. When the beam emitting points CH1 and CH2 are feed with a predetermined driving current and emit the laser beams LB1 and LB2 of the appropriate beam amount BA for scanning, the p-i-n photoreceptor 90C detects that the beam amounts of the laser beams LB1 and LB2 are BA1 and BA2. The reference values V1 and V2 should be determined in consideration of the relationship between the beam amounts BA1 and BA2.

For example, in the case of using the monolithic-structured laser diode 901, the laser element 90A is attached at a predetermined angle with respect to the stem 90D. In such a case, even if the beam emitting points CH1 and CH2 emit the laser beams LB1 and LB2 of the same beam amount BA, the beam amount of one laser beam incident upon the p-i-n photoreceptor 90C becomes larger than the other. For example, if the p-i-n photoreceptor 90C detects that the beam amount BA1 is smaller than the beam amount BA2, it is preferable to provide the reference values V1 and V2 with the reference value V1 being smaller than the reference value V2.

Referring to FIG. 1, the regulation circuit 70 provides both of the appropriate reference values V1 and V2. The regulation circuit 70 comprises a comparator (or, an operational amplifier) 71, transistors TR1 and TR2, resistances R1, R2, R3, R4, R5 and R6, a variable resistor VR including terminals t1, t2 and t3, and a capacitor C1. The regulation circuit 70 is supplied with constant voltage Vcc from a power source (not shown). The variable resistor VR comprises terminals t1 to t3, so that a resistance VR1-2 between the terminals t1 and t2 and a resistance VR2-3 between the terminals t2 and t3 are variable. In FIG. 1, the voltage, the resistances and the capacitor are indicated in numeric values, for explanation purposes.

The adjustment of the reference values V1 and V2 is usually performed during an assembly process of the multibeam scanner 100, and is finished by a single tuning operation. Namely, during the assembly process of the multibeam scanner 100, the variable resistor VR is adjusted so as to allocate the resistances VR1-2 and VR2-3 according to the ratio between the reference values V1 and V2.

The transistors TR1 and TR2 are for switching on and off the output of the reference values V1 and V2. The transistors TR1 and TR2 are switched off and on, respectively, when a voltage is applied to the transistor TR2 at a high level. By this, the outputs of the regulation circuit 70 (that is, the reference values V1 and V2) become valid. On the other hand, the transistors TR1 and TR2 are switched on and off, respectively, when a voltage is applied to the transistor TR2 at a low level. In this state, both of the reference values V1 and V2 are set to 0 V, at the same time, the APC circuits 60 and 61 control the sample-and-hold circuits 40 and 41 so that the outputs of the sample-hold circuits 40 and 41 become 0 V. Thus, the driving currents are not applied to the beam emitting points CH1 and CH2.

The following description is for an exemplary embodiment of when a voltage is applied to the transistor TR2 at a high level, whereby the outputs of the regulation circuit 70, namely V1 and V2 become valid.

The following equation [1] represents a reference value V0, wherein Rg stands for a composite resistance derived from an in-line resistance of R3 and R4 and the resistance of the variable resistor VR.

$$V0 = \frac{Rg}{R5 + Rg} \times Vcc \qquad [1]$$

The reference value V1 is determined based on a ratio of the resistance VR2-3 between the terminals t2 and t3 to the resistance VR1-3 between the terminals t1 and t3 of the variable resistor VR as defined by the following equation [2].

$$V1 = \frac{VR2-3}{VR1-3} \times V0 \qquad [2]$$

If, for example, the resistance VR2-3 is a half of the resistance VR1-3, the reference value V1 becomes V0/2. If, for example, the resistance VR2-3 is one third of the resistance VR1-3, the reference value V1 becomes V0/3.

Next, the following equation [3] holds true, wherein Vni stands for a voltage with respect to the non-inverting input of the comparator 71.

$$\frac{V0 - Vni}{R4} = \frac{Vni}{R3} \qquad [3]$$

The following equation [4] is derived by transforming the equation [3].

$$V0 = \left(1 + \frac{R4}{R3}\right) \times Vni \quad [4]$$

The equation [4] leads to the following equation [5], as R3 is equal to R4 in the exemplary embodiment shown in FIG. 1.

$$V0 = 2 \times Vin \quad [5]$$

The following equation [6] holds true, wherein Vi stands for a voltage with respect to the inverting input of the comparator 71.

$$\frac{V1 - Vi}{R2} = \frac{Vi - V2}{R1} \quad [6]$$

The following equation [7] is derived by transforming the equation [6].

$$V2 = \left(-\frac{R1}{R2}\right) \times V1 + \left(1 + \frac{R1}{R2}\right) \times Vi \quad [7]$$

The equation [7] leads to the following equation [8], as R1 is equal to R2 in an exemplary embodiment shown in FIG. 1.

$$V2 = -V1 + 2 \times Vi \quad [8]$$

The following equation [9] is derived from the equations [5] and [8], assuming that the voltage Vni is equal to the voltage Vi.

$$V0 = V1 + V2 \quad [9]$$

Therefore, the regulation circuit 70 provides the reference values V1 and V2, so that the total sum of the reference values V1 and V2 always becomes the base value V0. For example, if the reference value V1 is V0/2, the reference value V2 becomes V0/2. If the reference value V1 is V0/3, the reference value V2 becomes 2V0/3.

According to another exemplary embodiment of the invention, the beam source 90 may comprises beam emitting points CH1 to CHn, wherein n is an integer of 3 or more. The reference value Vn corresponds to the beam emitting point CHn. The regulation circuit 70 provides the reference values V1 to Vn, so that the total sum of the reference values V1 to Vn becomes the base value V0.

As described above, according to the invention, it is possible to provide the reference values for a plurality of beam emitting points, respectively, by using a single regulation circuit, and to easily set the reference values at a single and simple tuning operation. It is not necessary to provide a plurality of regulation circuits for the beam emitting points and it is not necessary to adjust each of the regulation circuits so as to provide the appropriate reference values, respectively. Therefore, it becomes possible to reduce the manufacturing cost and achieve a prompt assembly of the multibeam scanner 100.

In other exemplary embodiments, the regulation circuit 70 further comprises a plurality of resistances R that sandwich the variable resistor VR therebetween. The resistances R are preferably of a same value. In this case, it becomes possible to adjust the reference values more delicately.

Although the invention has been described through the above-mentioned exemplary embodiments, it should be understood that it is intended to cover other embodiments as well as all changes and modifications to the exemplary embodiments of the invention herein used for the purpose of the disclosure, which do not constitute departures from the spirit and scope of the invention.

What is claimed is:

1. A laser drive control apparatus for controlling a plurality of beam emitting points to emit a plurality of laser beams, respectively, to form scanning lines during a predetermined time period, the laser drive control apparatus comprising:

a first control unit that controls a plurality of beam emitting points to emit a plurality of laser beams successively except during a predetermined time period;

a photoreceptor that detects each of the laser beams emitted under the control of the first control unit, and generates a beam amount signal indicating a beam amount of the laser beam for each of the plurality of beam emitting points;

a providing unit that provides a plurality of reference values corresponding to the plurality of beam emitting points, respectively, when the photoreceptor generates the beam amount signals;

a comparison unit that compares the beam amount signals with the corresponding reference values, respectively; and a second control unit that controls, based on the comparison made by the comparison unit, the plurality of beam emitting points to emit the laser beams to form the scanning lines during the predetermined time period, wherein the plurality of reference values are set in the providing unit so that the plurality of reference values are interdependent with each other and the total sum of the reference values is a predetermined value, the providing unit includes a ratio unit that determines ratios among the plurality of reference values so that the total sum of the reference value is the predetermined value.

2. The laser drive control apparatus as claimed in claim 1, wherein the ratio unit comprises a variable resistor.

3. The laser drive control apparatus as claimed in claim 1, wherein the plurality of beam emitting points are a first beam emitting point and a second beam emitting point, the providing unit provides a first reference value corresponding to the first beam emitting point and a second reference value corresponding to the second beam emitting point, and the first and the second reference values are set so that the total sum of the first and the second reference values becomes the predetermined value.

4. The laser drive control apparatus as claimed in claim 3, wherein the providing unit comprises a setting unit that sets the predetermined value, a dividing unit that divides the first reference value by the predetermined value, and a subtracting unit that determines the second reference value by subtracting the first reference value from the predetermined value.

5. The laser drive control apparatus as claimed in claim 4, wherein the dividing unit comprises a variable resistor.

6. The laser drive control apparatus as claimed in claim 3, wherein the providing unit comprises a ratio unit that determines a ratio between the first and the second reference values so that the total sum of the first and the second reference values is the predetermined value, the ratio unit comprises a variable resistor.

7. A laser drive control apparatus for controlling a plurality of beam emitting points to emit a plurality of laser beams, respectively, to form scanning lines during a predetermined time period, comprising:

first controlling means for controlling a plurality of beam emitting points to emit a plurality of laser beams successively except during a predetermined time period;

detecting means for detecting each of the laser beams emitted under the control of the first controlling means;

generating means for generating a beam amount signal indicating a beam amount of the laser beam for each of the plurality of beam emitting points;

providing means for providing a plurality of reference values corresponding to the plurality of beam emitting points, respectively, when the beam amount signals are generated;

comparing means for comparing the beam amount signals with the corresponding reference values, respectively; and second controlling means for controlling, based on the comparison made by the comparing means, the plurality of beam emitting points to emit the laser beams to form the scanning lines during the predetermined time period, wherein the plurality of reference values are set in the providing means, so that the plurality of reference values are interdependent with each other and the total sum of the reference values is a predetermined value.

8. The laser drive control apparatus as claimed in claim 7, wherein the providing means comprises ratio means that determines ratios among the plurality of reference values so that the total sum of the reference values is the predetermined value.

9. The laser drive control apparatus as claimed in claim 8, wherein the ratio means comprises a variable resistor.

10. A method for controlling a plurality of beam emitting points to emit a plurality of laser beams, respectively, to form scanning lines during a predetermined time period, comprising:

first controlling a plurality of beam emitting points to emit a plurality of laser beams successively except during a predetermined time period;

detecting each of the laser beams emitted in the first controlling step;

generating a beam amount signal indicating a beam amount of the laser beam for each of the plurality of beam emitting points;

providing a plurality of reference values corresponding to the plurality of beam emitting points, respectively, when the beam amount signals are generated;

comparing the beam amount signals with the corresponding reference values, respectively; and second controlling, based on the comparison made in the comparing step, the plurality of beam emitting points to emit the laser beams to form the scanning lines during the predetermined time period, wherein the plurality of reference values are set in the providing step, so that the plurality of reference values are interdependent with each other and the total sum of the reference values is a predetermined value.

11. The method as claimed in claim 10, wherein the providing step further comprises determining ratios among the plurality of reference values so that the total sum of the reference values is the predetermined value.

12. The method as claimed in claim 11, wherein the determining ratios step further comprises adjusting a variable resistor.

13. The method as claimed in claim 10, wherein:

the plurality of beam emitting points are a first beam emitting point and a second beam emitting point; and the providing step provides a first reference value corresponding to the first beam emitting point and a second reference value corresponding to the second beam emitting point, and the first and the second reference values are set so that the total sum of the first and the second reference values becomes the predetermined value.

14. The method as claimed in claim 13, wherein the providing step further comprises:

setting the predetermined value;

dividing the first reference value by the predetermined value; and determining the second reference value by subtracting the first reference value from the predetermined value.

15. The method as claimed in claim 13, wherein the providing step further comprises determining a ratio between the first and the second reference values so that the total sum of the first and the second reference values is the predetermined value.

16. A method of setting a plurality of reference values corresponding to a plurality of beam emitting points, respectively, for use in controlling the plurality of beam emitting points to emit laser beams of appropriate amounts, the method comprising:

determining ratios among the plurality of reference values so that the total sum of the plurality of reference values is a predetermined value.

17. A method as claimed in claim 16, further comprising setting the predetermined value.

18. A method as claimed in claim 16, wherein the plurality of reference values includes a first reference value and a second reference value and the determining ratios step further comprises:

determining the first reference value; and determining the second reference value by subtracting the first reference value from the predetermined value.

* * * * *